United States Patent
Tsuzumitani et al.

(10) Patent No.: US 6,884,674 B2
(45) Date of Patent: Apr. 26, 2005

(54) METHOD FOR FABRICATING A SEMICONDUCTOR DEVICE INCLUDING A CAPACITANCE INSULATING FILM HAVING A PEROVSKITE STRUCTURE

(75) Inventors: Akihiko Tsuzumitani, Osaka (JP); Hisashi Ogawa, Osaka (JP); Yasutoshi Okuno, Kyoto (JP); Yoshihiro Mori, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 76 days.

(21) Appl. No.: 10/365,502

(22) Filed: Feb. 13, 2003

(65) Prior Publication Data

US 2003/0155596 A1 Aug. 21, 2003

(30) Foreign Application Priority Data

Feb. 15, 2002 (JP) .................................... 2002-038216

(51) Int. Cl.$^7$ .......................................... H01L 21/8242
(52) U.S. Cl. ..................... 438/240; 438/255; 438/398; 438/660
(58) Field of Search .......................... 438/3, 239, 240, 438/253, 255, 256, 396, 398, 399, 658, 660, 665

(56) References Cited

U.S. PATENT DOCUMENTS

| 5,973,911 | A  | * | 10/1999 | Nishioka ..................... 361/313 |
| 6,335,207 | B1 | * | 1/2002  | Joo et al. ........................ 438/3 |
| 6,337,239 | B1 | * | 1/2002  | Dehm et al. ................. 438/240 |
| 6,365,420 | B1 | * | 4/2002  | Ashida ........................... 438/3 |
| 6,396,092 | B1 | * | 5/2002  | Takatani et al. ............ 257/295 |
| 6,579,754 | B1 | * | 6/2003  | Suenaga et al. ............ 438/240 |

FOREIGN PATENT DOCUMENTS

| JP | 09282943 A | * | 10/1997 | ............ H01B/3/00 |
| JP | 10012832 A | * | 1/1998 | ........... H01L/27/10 |

* cited by examiner

*Primary Examiner*—George Eckert
(74) *Attorney, Agent, or Firm*—McDermott Will & Emery LLP

(57) ABSTRACT

A semiconductor device has a capacitance insulating film having a perovskite structure represented by the general formula $ABO_3$ (where each of A and B is a metal element) and first and second electrodes opposed to each other with the capacitance insulating film interposed therebetween. The capacitance insulating film is formed such that the composition of the metal element A or B is higher in the region thereof adjacent the first electrode than in the other region thereof.

8 Claims, 5 Drawing Sheets

DEPTH FROM UPPER SURFACE OF UPPER ELECTRODE FORMING FILM

METHOD FOR FABRICATING A SEMICONDUCTOR DEVICE INCLUDING A CAPACITANCE INSULATING FILM HAVING A PEROVSKITE STRUCTURE

BACKGROUND OF THE INVENTION

The present invention relates to a semiconductor device and a method for fabricating the same and, more particularly, to a semiconductor device having a capacitance insulating film composed of a high dielectric material or a ferroelectric material and a method for fabricating the same.

In recent years, a memory cell portion in a semiconductor memory device has been scaled down increasingly with design miniaturization.

A memory cell portion in a dynamic random access memory (DRAM) device which is among semiconductor memory devices is composed of a capacitor for storing charges and a pass gate transistor for selectively making the capacitor accessible. In a typical DRAM device, even if the plan size of a memory cell portion is reduced and the projected area of a capacitor is thereby reduced, the storage capacitance of the capacitor cannot be reduced for lower power consumption and for the prevention of a soft error.

The storage capacitance of a capacitor is directly proportional to the relative dielectric constant of a dielectric film composing a capacitance insulating film and to the area of the dielectric film interposed between opposing electrodes, while it is inversely proportional to the thickness of the dielectric film. If the thickness of the dielectric film is reduced for an increase in the storage capacitance of the capacitor, a leakage current in the capacitor increases and therefore a refresh cycle time in the memory cell portion should be increased, which leads to increased power consumption. This places a limit on a reduction in the thickness of the dielectric film used as the capacitance insulating film.

In recent years, the use of a dielectric material having a high relative dielectric constant for a capacitance insulating film has been studied vigorously in an attempt to increase the storage capacitance of a capacitor. As exemplary materials having high relative dielectric constants, metal oxides such as an aluminum oxide ($Al_2O_3$) and a tantalum pentoxide ($Ta_2O_5$) and composite metal oxides each having a perovskite crystal structure represented by the general formula $ABO_3$ (where each of A and B is a metal element), such as barium strontium titanium oxide (($Ba,Sr)TiO_3$, hereinafter referred to as BST), lead zirconium titanium oxide ($Pb(Zr,Ti)O_3$, hereinafter referred to as PZT), and strontium bismuth tantalum oxide ($SrBi_2Ta_2O_9$, hereinafter referred to as SBT) have been studied in detail.

In forming a thin film from such a high dielectric material, a chemical reaction is used normally in most cases. Since the thin film is formed in an oxidizing atmosphere, if silicon (Si) used commonly is used for an electrode, the silicon is easily oxidized to form a silicon dioxide film having a low relative dielectric constant so that it is difficult to increase the capacitance value of the capacitor.

For the electrode of a capacitor using a high dielectric film as a capacitance insulating film, therefore, a precious metal, a refractory metal, or the like is used. If BST is used for the capacitance insulating film, e.g., ruthenium (Ru), ruthenium dioxide ($RuO_2$), platinum (Pt), iridium (Ir), or the like is used for the electrode. If a ferroelectric film composed of SBT or PZT is used as the capacitance insulating film, platinum (Pt), iridium (Ir), iridium dioxide ($IrO_2$), or the like is used for the electrode.

As an electrode for a capacitor using a high dielectric material or a ferroelectric material has been miniaturized increasingly in recent years, the electric characteristic or reliability of the capacitor is more greatly influenced by step coverage in the formation of a capacitance insulating film. Under such circumstances, research on the formation of a capacitance insulating film by chemical vapor deposition, which is excellent in step coverage, has been pursued. In particular, step coverage is further improved if a temperature range in a region where the rate of a surface reaction is determined is used in chemical vapor deposition.

However, the foregoing conventional method for fabricating a semiconductor device by chemical vapor deposition has the problem that the density or composition ratio of a film to be formed varies depending on the surface state of a film underlying the film to be formed. If the density of the film varies, e.g., a desired thickness cannot be achieved or the thickness of the film varies depending on the surface state of the underlying film. If the composition ratio of the film varies, on the other hand, desired properties including a relative dielectric constant cannot be obtained.

SUMMARY OF THE INVENTION

It is therefore an object of the present invention to solve the foregoing conventional problems and allows, in forming a dielectric film having a perovskite structure by chemical vapor deposition as a capacitance insulating film, the dielectric film having desired properties to be obtained reliably and stably irrespective of the surface state of an underlying layer.

To attain the object, a method for fabricating a semiconductor device according to the present invention forms, in forming a capacitance insulating film having a perovskite structure represented by the general formula $ABO_3$ (where each of A and B is a metal element), nuclei for forming the capacitance insulating film which contains the metal A or B on the surface of an underlying layer (lower electrode).

In a high dielectric film or a ferroelectric film having a perovskite ($ABO_3$) crystal structure, the metal element A or B is mostly titanium (Ti), tantalum (Ta), or the like as in, e.g., BST, $BaTiO_3$ (hereinafter referred to as BTO), $SrTiO_3$ (hereinafter referred to as STO), PZT, SBT, or the like.

As a result of elaborately examining a method for forming a high dielectric material or a ferroelectric material having a perovskite crystal structure, the present inventors have made the following finding.

That is, titanium atoms or tantalum atoms are easily diffused in a metal film composed of platinum to be precipitated on the surface of the metal film. If a dielectric film having a perovskite structure composed of, e.g., BST is formed by chemical vapor deposition on an underlying layer on the surface of which the titanium or tantalum atoms are precipitated, the thickness of the formed dielectric film becomes uniform. This may be because the titanium or tantalum atoms precipitated on the surface of platinum composing the underlying layer served as the nuclei of BST at the initial stage of BST film formation by chemical vapor deposition. As a result, the BST film formed can have a uniform thickness independently of the surface state of the underlying layer.

As a result of examining the properties of a nitride or oxide of titanium or tantalum in platinum, the present inventors have also made the finding that, since titanium or tantalum is hard to completely nitride or oxidize, unoxidized or unnitrided titanium or tantalum atoms are easily diffused in platinum and precipitated on the surface thereof.

This indicates that the quantity of titanium or tantalum atoms diffused in platinum is adjustable from the outside by oxidizing or nitriding titanium or tantalum. Accordingly, the density of nuclei composed of titanium or tantalum can be controlled.

The present inventors have also made the finding that the dielectric constant of the BST film formed by using the precipitated nuclei is lower and more uneven in the surface as the amount of precipitated titanium or tantalum is larger As a result of examining the phenomenon in greater detail, the present inventors have concluded that, if titanium or tantalum exists in an excessive amount at the interface between BST and platinum, the dielectric constant of BST lowers and the uniformity thereof deteriorates.

In accordance with the present invention, therefore, an oxidizing process or a nitriding process is performed with respect to an underlying layer (lower electrodes) in a process in which titanium atoms, tantalum atoms, or the like are precipitated in a large quantity on the surface of the underlying layer or a composition which coincides with a metal element composing the underlying layer is reduced at the initial stage of the formation of a capacitance insulating film composed of a dielectric material having a perovskite structure. This prevents a phenomenon in which the metal forming the nuclei is precipitated in an excessive amount.

Specifically, a first method for fabricating a semiconductor device according to the present invention aims at a method for fabricating a semiconductor device including a capacitance insulating film having a perovskite structure represented by a general formula $ABO_3$ (where each of A and B is a metal element), the method comprising: a first step of forming a precipitation layer forming film containing the metal element A or B; a second step of forming a first electrode forming film on the precipitation layer forming film; a third step of patterning the first electrode forming film to form a first electrode from the first electrode forming film; a fourth step of annealing the first electrode to form, on a surface of the first electrode, a precipitation layer composed of the precipitated metal element A or B composing the precipitation layer forming film; a fifth step of forming, by chemical vapor deposition, the capacitance insulating film such that the first electrode including the precipitation layer is covered therewith; and a sixth step of forming a second electrode forming film such that the capacitance insulating film is covered therewith.

In accordance with the first method for fabricating a semiconductor device, the precipitation layer precipitated on the surface of the first electrode as the underlying layer allows the capacitance insulating film having a uniform thickness and uniform quality to be obtained independently of the surface state of the first electrode. This allows a capacitor element having desired characteristics to be formed reliably and stably.

A second method for fabricating a semiconductor device aims at a method for fabricating a semiconductor device including a capacitance insulating film having a perovskite structure represented by a general formula $ABO_3$ (where each of A and B is a metal element), the method comprising: a first step of forming a precipitation layer forming film containing the metal element A or B; a second step of forming a first electrode forming film on the precipitation layer forming film; a third step of annealing the first electrode to form, on a surface of the first electrode, a precipitation layer composed of the precipitated metal element A or B composing the precipitation layer forming film; a fourth step of patterning the first electrode forming film to form a first electrode from the first electrode forming film; a fifth step of forming, by chemical vapor deposition, the capacitance insulating film such that the first electrode including the precipitation layer is covered therewith; and a sixth step of forming a second electrode forming film such that the capacitance insulating film is covered therewith.

In accordance with the second method for fabricating a semiconductor device, the precipitation layer precipitated on the surface of the first electrode as the underlying layer allows the capacitance insulating film having a uniform thickness and uniform quality to be obtained independently of the surface state of the first electrode in the same manner as in the first method for fabricating a semiconductor device.

In the first or second method for fabricating a semiconductor device, the precipitation layer forming film preferably has a thickness not less than about 1 nm and not more than about 100 nm.

Preferably, the first or second method for fabricating a semiconductor device further comprises, between the first and second steps, the step of: partly oxidizing or nitriding the deposited precipitation layer forming film.

This achieves a reduction in the amount of the metal element A or B precipitated on the upper surface of the first electrode and thereby prevents the composition of the metal element A or B in the capacitance insulating film from becoming excessively high.

In the first or second method for fabricating a semiconductor device, the fifth step preferably includes forming the capacitance insulating film such that a composition of the capacitance insulating film which coincides with a composition of the precipitation layer forming film is lower in a region of the capacitance insulating film adjacent an interface with the first electrode than in the other region thereof.

This achieves a reduction in the composition of the metal element A or B in the region of the capacitance insulating film adjacent the first electrode and thereby prevents the composition of the A or B from becoming excessively high.

In the first or second method for fabricating a semiconductor device, the capacitance insulating film is preferably composed of $(Ba, Sr)TiO_3$, $BaTiO_3$, $SrTiO_3$, $Pb(Zr, Ti)O_3$, or $SrBi_2Ta_2O_9$.

A semiconductor device according to the present invention comprises: a capacitance insulating film having a perovskite structure represented by a general formula $ABO_3$ (where each of A and B is a metal element); and first and second electrodes opposed to each other with the capacitance insulating film interposed therebetween, the capacitance insulating film being formed such that a composition of the metal element A or B is higher in a region thereof adjacent the first electrode than in the other region thereof.

The semiconductor device according to the present invention is obtained by the first or second method for fabricating a semiconductor device according to the present invention so that the region of the capacitance insulating film adjacent the first electrode has a composition of the metal A or B which is higher than in the other region thereof under the influence of the precipitation layer composed of the metal A or B. Consequently, the capacitance insulating film having a perovskite structure of the semiconductor device according to the present invention has a substantially uniform thickness irrespective of the state of the interface with the first electrode.

Preferably, the semiconductor device according to the present invention further comprises: a precipitation layer forming film disposed on a side of the first electrode opposite to the capacitance insulating film in contact relation with the first electrode and containing the metal element A or B.

In this case, the precipitation layer forming film preferably has a thickness not less than about 1 nm and not more than about 20 nm.

In the semiconductor device according to the present invention, the capacitance insulating film is preferably composed of (Ba, Sr)TiO$_3$, BaTiO$_3$, SrTiO$_3$, Pb(Zr, Ti)O$_3$, or SrBi$_2$Ta$_2$O$_9$.

BRIEF DESCRIPTION OF THE DRAWINGS

FIGS. 2A and 2B show a semiconductor device according to the first embodiment, of which FIG. 2A is a structural cross-sectional view showing one capacitor and FIG. 2B is a graph showing a concentration profile of titanium in the X$_1$-X$_2$ direction of FIG. 2A;

DETAILED DESCRIPTION OF THE INVENTION

Embodiment 1

A first embodiment of the present invention will be described with reference to the drawings.

FIGS. 1A to 1E diagrammatically show the cross-sectional structures of a DRAM device as a semiconductor device according to the first embodiment in the individual process steps of a fabrication method therefor.

First, a plurality of memory cell transistors (pass gate transistors) each including a gate electrode, a source region, and a drain region are formed in the memory cell portion of a semiconductor substrate 11 formed as a wafer composed of silicon and having a diameter of, e.g., 20.3 cm (8 inches), though they are not shown.

Figure 1A:
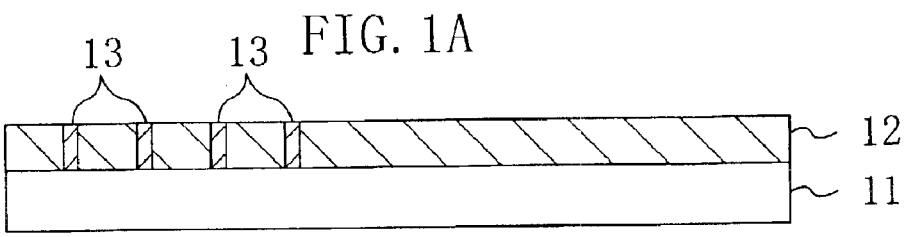
FIGS. 1A to 1E are structural cross-sectional views diagrammatically illustrating the process steps of a method for fabricating a semiconductor device according to a first embodiment of the present invention.

Next, as shown in FIG. 1A, an interlayer insulating film 12 composed of, e.g., silicon dioxide with a thickness of about 0.5 μm is deposited by chemical vapor deposition (CVD) over an entire surface of the semiconductor substrate 11 to cover the memory cell transistors. Subsequently, a plurality of connection holes (contact holes) are formed by lithography and dry etching in the deposited interlayer insulating film 12 to expose the respective source regions of the memory cell transistors. Thereafter, a polysilicon film is deposited by CVD on the interlayer insulating film 12 such that each of the connection holes is filled therewith. By further performing planarization with respect to the deposited polysilicon film by chemical mechanical polishing (CMP) or the like, plugs 13 composed of polysilicon are formed in the respective connection holes.

Figure 1B:
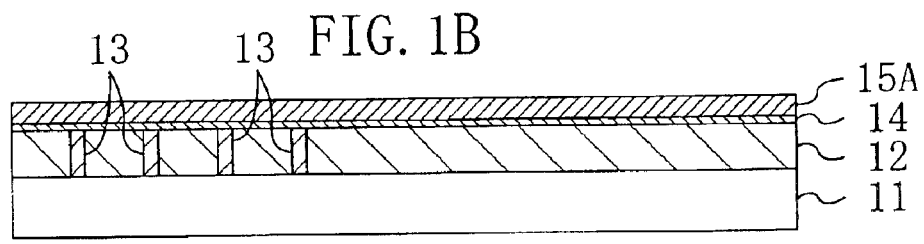

Next, as shown in FIG. 1B, a precipitation layer forming film 14 composed of titanium (Ti) with a thickness of about 10 nm is formed on the interlayer insulating film 12 containing the plugs 13 and having an upper surface planarized. Subsequently, a lower electrode forming film 15A composed of platinum (Pt) with a thickness of about 100 nm is formed by sputtering on the precipitation layer forming film 14.

Figure 1C:
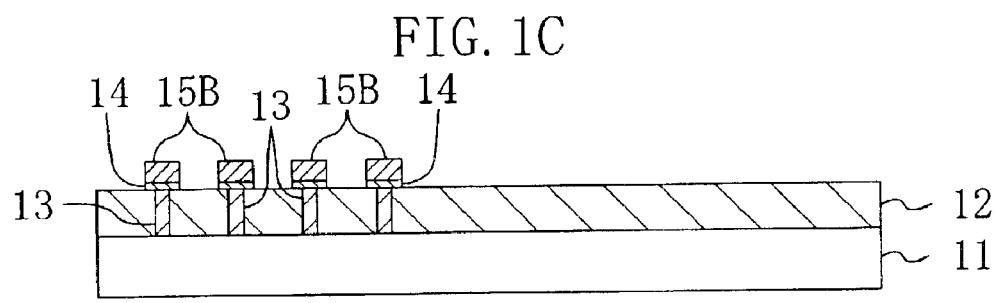

Next, as shown in FIG. 1C, the lower electrode forming film 15A and the precipitation layer forming film 14 are patterned by lithography and dry etching to contain the plugs 13 such that lower electrodes 15B are formed from the lower electrode forming film 15A.

Figure 1D:
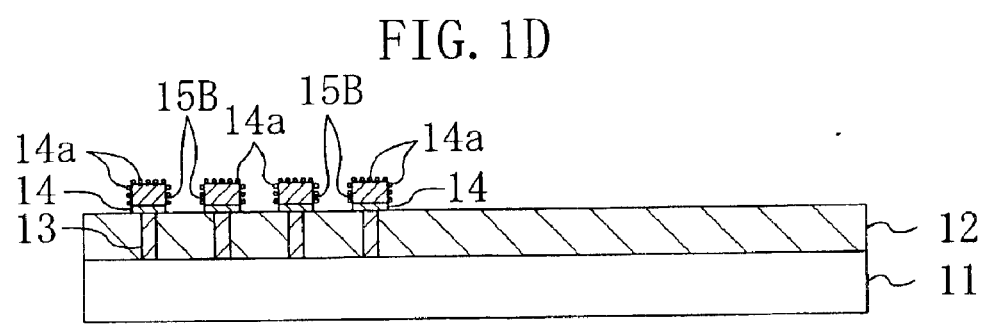

Next, as shown in FIG. 1D, the lower electrodes 15B are annealed at a temperature of about 300° C. for about 5 minutes, whereby titanium atoms composing the precipitation layer forming film 14 are diffused into the lower electrodes 15B and precipitated on the surfaces thereof (the upper and side surfaces thereof) to form precipitation layers 14a.

Figure 1E:
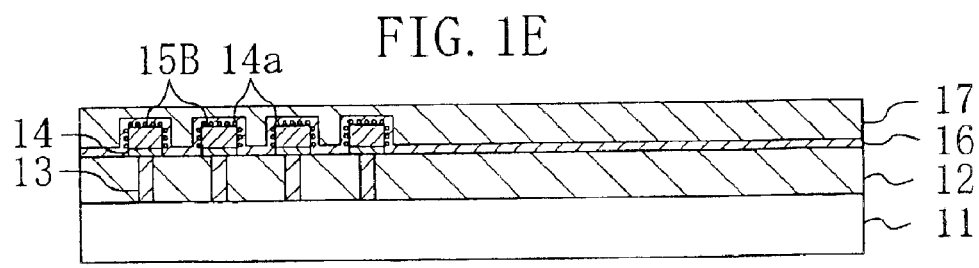

Next, as shown in FIG. 1E, a capacitance insulating film 16 composed of BST with a thickness of about 20 nm is formed by CVD on the interlayer insulating film 12 to cover the lower electrodes 15B formed with the precipitation layers 14a composed of titanium. As the raw material of BST, a solution prepared by dissolving Ba(THD)$_2$ (=bis(tetramethylheptanedionate)barium), Sr(TAD)$_2$(=bis(tetramethylheptanedionate)strontium, and Ti(THD)$_2$(O-i-Pr)$_2$ (=bis(isopropoxy)bis(tetramethylheptanedionate) titanium) in THF (=tetrahydrofuran) as a solvent is used.

Subsequently, an upper electrode forming film 17 composed of platinum (Pt) with a thickness of about 100 nm is formed by sputtering or CVD on the capacitance insulating film 16, whereby a plurality of capacitors each composed of the lower electrode 15B, the capacitance insulating film 16, and the upper electrode forming film 17 are obtained.

Thus, the first embodiment uses the phenomenon in which the titanium atoms composing the capacitance insulating film 16 are easily diffused in the lower electrodes 15B composed of platinum which serve as underlying layers for the capacitance insulating film 16 to form, by annealing, the precipitation layers 14a composed of the titanium atoms precipitated on the surfaces of the lower electrodes 15B. Since the precipitated titanium atoms serve as nuclei at the initiation of BST film formation, the thickness of the capacitance insulating film 16 formed on the lower electrodes 15B is uniform without depending on the surface state of each of the lower electrodes 15B.

Since the temperature in the chamber of a CVD apparatus becomes 200° C. or more during the formation of the capacitance insulating film 16 shown in FIG. 1E, the annealing step for forming the precipitation layers 14a may also be performed within the chamber.

Figure 2A:
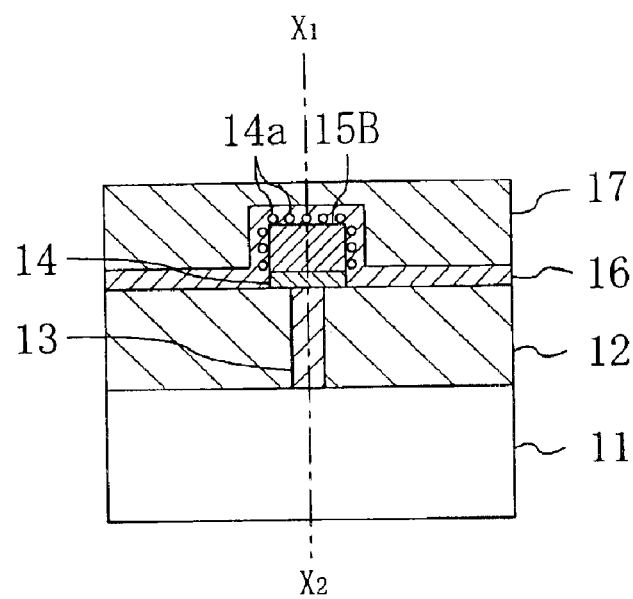
Figure 2B:
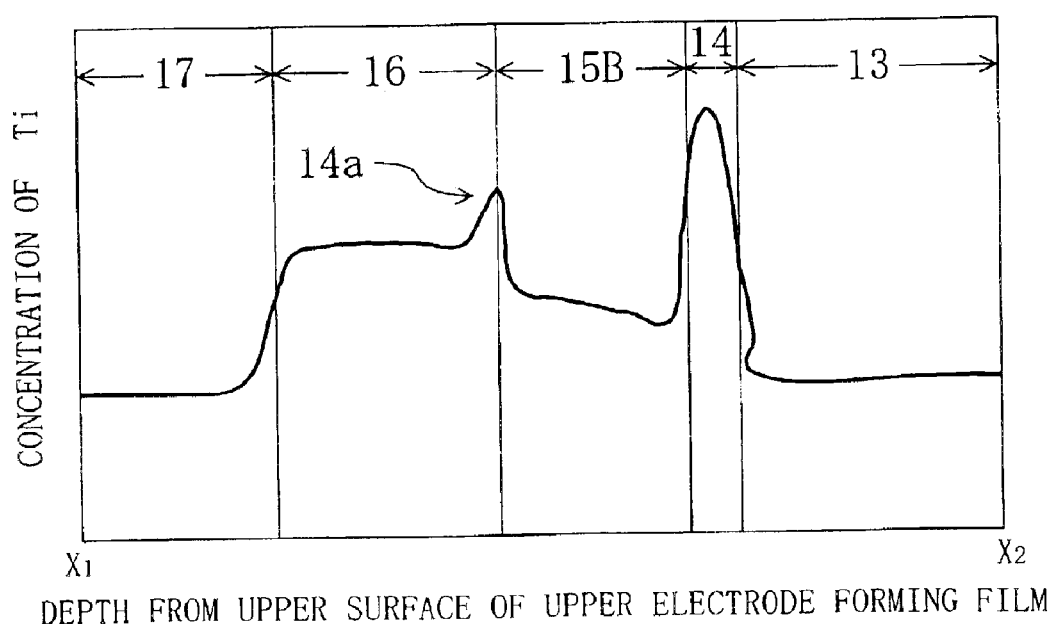

FIGS. 2A and 2B show a semiconductor device according to the first embodiment, of which FIG. 2A shows a cross-sectional structure of one capacitor and FIG. 2B shows a concentration profile of titanium (Ti) in the X$_1$-X$_2$ direction of FIG. 2A. The components in FIGS. 2A and 2B which are the same as in FIG. 1E are designated by the same reference numerals.

FIG. 2B shows the result of measuring the concentration of titanium atoms by XPS (X-ray photoelectron spectroscopy) or SIMS (secondary electron ion mass spectroscopy). In FIG. 2B, the abscissa axis represents the distance in the direction of depth from the upper surface of the upper electrode forming film 17 toward the substrate 11 and the ordinate axis represents the concentration of titanium. From FIG. 2B, it will be understood that the concentration of titanium atoms has a first peak resulting from the precipitation layers 14a composed of the titanium atoms diffused from the precipitation layer forming film 14 and precipitated at the interfaces between the lower electrodes 15B and the capacitance insulating film 16.

The concentration of titanium atoms also has a second peak resulting from the precipitation layer forming film 14 between the lower electrodes 15B and the plugs 13. The concentration of the second peak is determined by the thickness of the precipitation layer forming film 14 under formation.

Referring to the drawings, a description will be given herein below to the preferred range of the thickness of the precipitation layer forming film 14.

Figure 3:
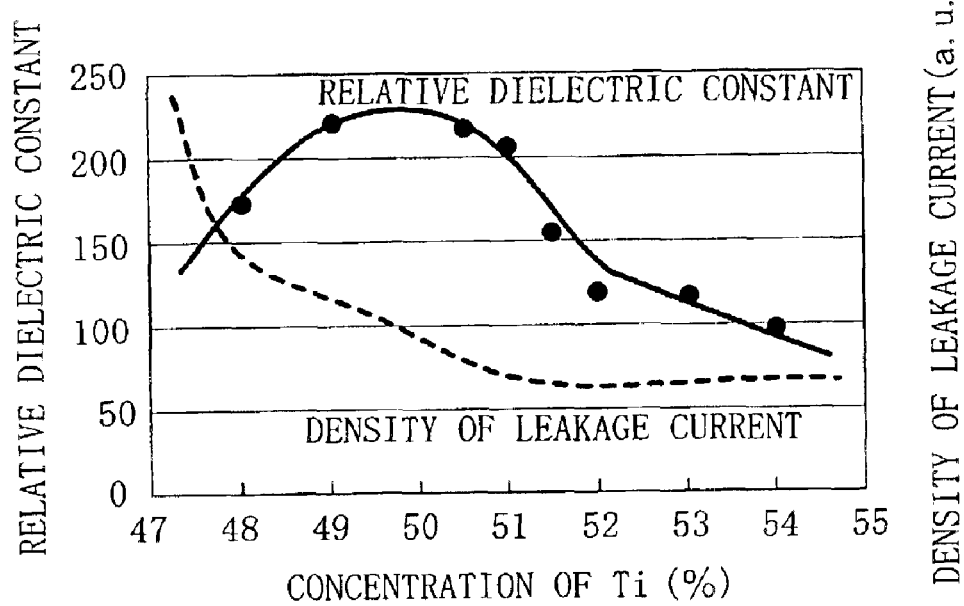
FIG. 3 is a graph showing the relationship among the relative dielectric constant of BST, the density of a leakage current therein, and the composition of titanium therein.

FIG. 3 shows the relationship among the relative dielectric constant of BST, the density of a leakage current therein, and the composition of titanium therein. In the drawing, the abscissa axis represents the composition (%) of titanium, the ordinate axis on the left hand represents the relative dielectric constant, and the ordinate axis on the right hand represents the density (arbitrary unit) of a leakage current when a voltage in excess of a specified value by only 1 V is applied. As can be seen from FIG. 3, the relative dielectric constant of BST is reduced significantly if the composition of titanium exceeds 51%. If the composition of titanium becomes lower than 48%, on the other hand, the relative dielectric constant of BST is also reduced and the leakage current is excessively increased so that it is difficult to use BST for the device.

To reduce the composition of titanium in the region of the capacitance insulating film 16 composed of BST according to the first embodiment adjacent the interfaces with the lower electrodes 15B, it is therefore preferable to adjust the thickness of the precipitation layer forming film 14 to a value not less than about 1 nm and not more than about 100 nm. If the thickness of the precipitation layer forming film 14 is set to 1 nm or less, titanium composing the precipitation layers 14a is oxidized to form a titanium oxide, which does not serve as nuclei at the initiation of the formation of a BST film composing the capacitance insulating film 16.

After the formation of the precipitation layer forming film 14, if annealing is performed in an oxygen atmosphere or a nitrogen atmosphere at about 300° C. for about 1 minute to oxidize or nitride some of titanium atoms, the quantity of precipitated titanium atoms in the precipitation layers 14a can be reduced so that the first peak shown in FIG. 2A disappears. This allows the composition of titanium in BST composing the capacitance insulating film 16 to be optimized to about 48% to 51%, while preventing a reduction in the dielectric constant of the capacitance insulating film 16 and an increase in leakage current, so that the resulting capacitor has desired electric characteristics.

Variation of Embodiment 1

A variation of the first embodiment of the present invention will be described with reference to the drawings.

FIGS. 4A to 4E diagrammatically illustrate the cross-sectional structures of a DRAM device as a semiconductor device according to a variation of the first embodiment in a fabrication method therefor. The components in FIGS. 4A to 4E which are the same as in FIGS. 1A to 1E are designated by the same reference numerals.

First, a plurality of memory cell transistors each including a gate electrode, a source region, and a drain region are formed in the memory cell portion of a semiconductor substrate 11 in the same manner as in the first embodiment.

Figure 4A:
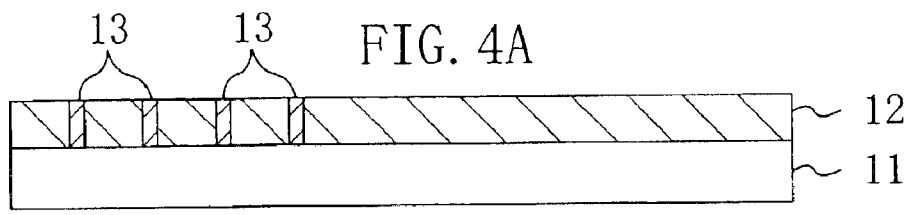
FIGS. 4A to 4E are structural cross-sectional views diagrammatically illustrating the process steps of a method for fabricating a semiconductor device according to a variation of the first embodiment.

Next, as shown in FIG. 4A, an interlayer insulating film 12 composed of, e.g., a silicon dioxide film with a thickness of about 0.5 μm is deposited by CVD over an entire surface of the semiconductor substrate 11 to cover the memory cell transistors. Subsequently, a plurality of connection holes are formed by lithography and dry etching in the deposited interlayer insulating film 12 to expose the respective source regions of the memory cell transistors. Thereafter, a polysilicon film is deposited by CVD on the interlayer insulating film 12 such that each of the connection holes is filled therewith. By further performing planarization with respect to the deposited polysilicon film, plugs 13 composed of polysilicon are formed in the respective connection holes.

Figure 4B:
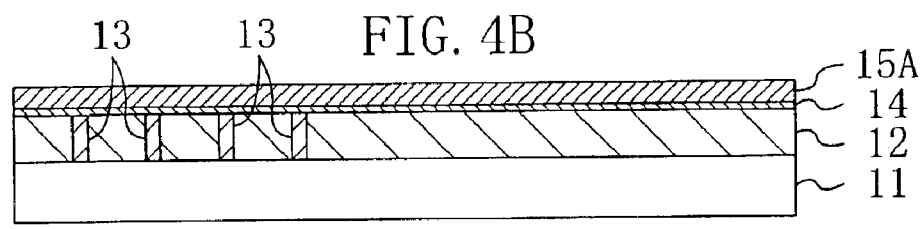

Next, as shown in FIG. 4B, a precipitation layer forming film 14 composed of titanium (Ti) with a thickness of about 10 nm is formed on the interlayer insulating film 12 containing the plugs 13 and having an upper surface planarized. Subsequently, a lower electrode forming film 15A composed of platinum (Pt) with a thickness of about 100 nm is formed by sputtering on the precipitation layer forming film 14.

Figure 4C:
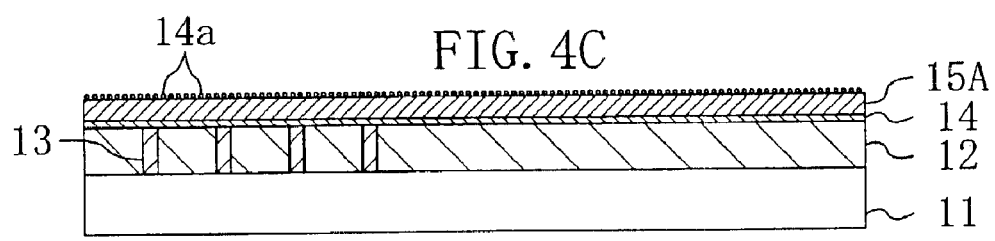

Next, as shown in FIG. 4C, the lower electrode forming film 15A is annealed at a temperature of about 300° C. for about 5 minutes, whereby titanium atoms composing the precipitation layer forming film 14 are diffused in the lower electrode forming film 15A and precipitated on the surfaces thereof (the upper surface thereof) to form precipitation layers 14a.

Figure 4D:
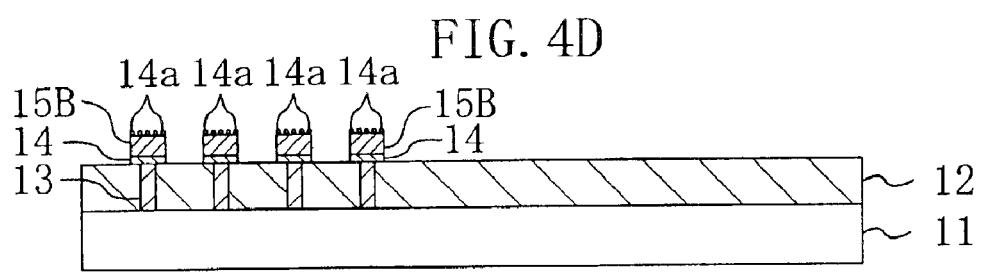

Next, as shown in FIG. 4D, the precipitation layers 14a, the lower electrode forming film 15A, and the precipitation layer forming film 14 are patterned by lithography and dry etching to contain the plugs 13 such that lower electrodes 15B are formed from the lower electrode forming film 15A.

Figure 4E:
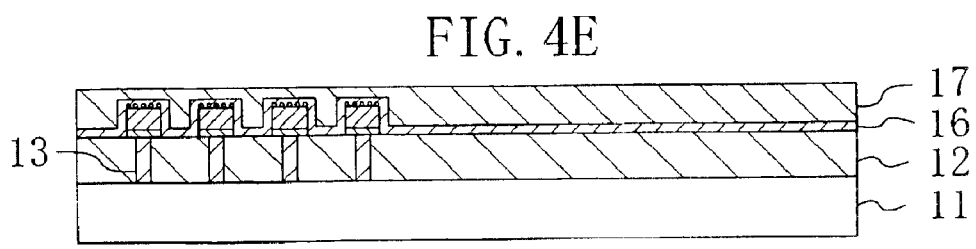

Next, as shown in FIG. 4E, a capacitance insulating film 16 composed of BST with a thickness of about 20 nm is formed by CVD on the interlayer insulating film 12 to cover the lower electrodes 15B formed with the precipitation layers 14a composed of titanium. Subsequently, an upper electrode forming film 17 composed of platinum (Pt) with a thickness of about 100 nm is formed by sputtering or CVD on the capacitance insulating film 16, whereby a plurality of capacitors each composed of the lower electrodes 15B, the capacitance insulating film 16, and the upper electrode forming film 17 are obtained.

In the present variation also, if annealing is performed in an oxygen atmosphere or a nitrogen atmosphere at about 300° C. for about 1 minute to oxidize or nitride some of titanium atoms after the formation of the precipitation layer forming film 14, the quantity of titanium atoms precipitated on the surface of the lower electrode forming film 15A can be controlled.

Embodiment 2

A second embodiment of the present invention will be described with reference to the drawings.

FIGS. 5A to 5E diagrammatically illustrate the cross-sectional structures of a DRAM device as a semiconductor device according to the second embodiment in a fabrication method therefor. The components in FIGS. 5A to 5E which are the same as in FIGS. 1A to 1E are designated by the same reference numerals.

First, a plurality of memory cell transistors each including a gate electrode, a source region, and a drain region are formed in the memory cell portion of a semiconductor substrate 11 in the same manner as in the first embodiment.

Figure 5A:
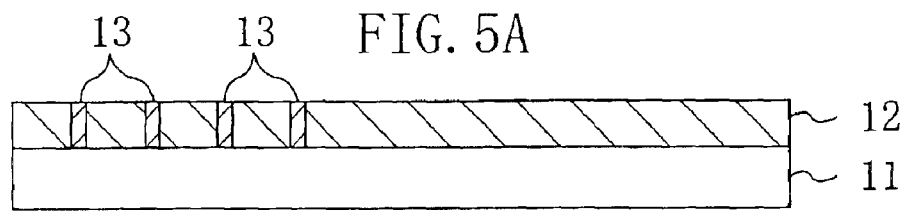
FIGS. 5A to 5E are structural cross-sectional views diagrammatically illustrating the process steps of a method for fabricating a semiconductor device according to a second embodiment of the present invention.

Next, as shown in FIG. 5A, an interlayer insulating film 12 composed of, e.g., a silicon dioxide film with a thickness of about 0.5 μm is deposited by CVD over an entire surface of the semiconductor substrate 11 to cover the memory cell transistors. Subsequently, a plurality of connection holes are formed by lithography and dry etching in the deposited interlayer insulating film 12 to expose the respective source regions of the memory cell transistors. Thereafter, a polysilicon film is deposited by CVD on the interlayer insulating film 12 such that each of the connection holes is filled therewith. By further performing planarization with respect to the deposited polysilicon film, plugs 13 composed of polysilicon are formed in the individual connection holes.

Figure 5B:
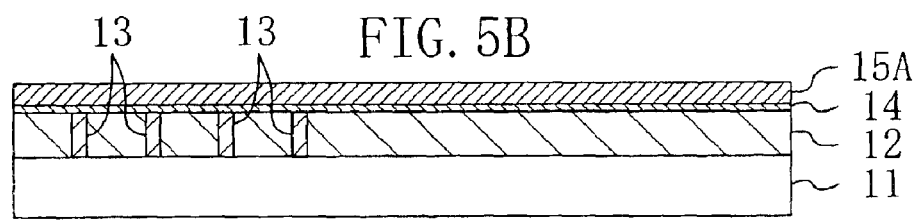

Next, as shown in FIG. 5B, a precipitation layer forming film 14 composed of titanium (Ti) with a thickness of about 10 nm is formed on the interlayer insulating film 12 containing the plugs 13 and having an upper surface planarized. Subsequently, a lower electrode forming film 15A composed of platinum (Pt) with a thickness of about 100 nm is formed by sputtering on the precipitation layer forming film 14.

Figure 5C:
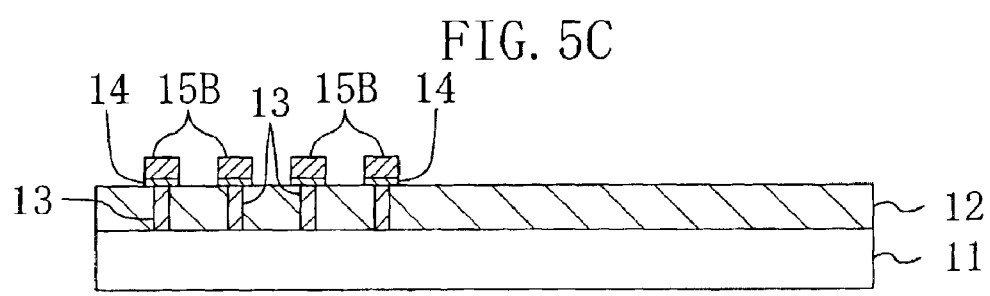

Next, as shown in FIG. 5C, the lower electrode forming film 15A and the precipitation layer forming film 14 are patterned by lithography and dry etching to contain the plugs 13 such that lower electrodes 15B are formed from the lower electrode forming film 15A.

Figure 5D:
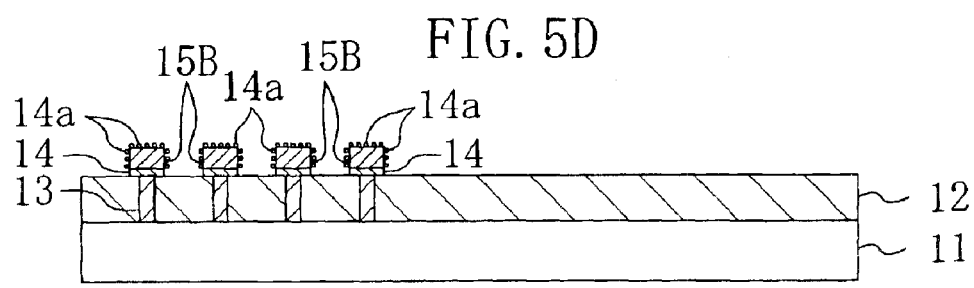

Next, as shown in FIG. 5D, the lower electrodes 15B are annealed at a temperature of about 300° C. for about 5 minutes, whereby titanium atoms composing the precipitation layer forming film 14 are diffused into the lower electrodes 15B and precipitated on the surfaces thereof to form precipitation layers 14$a$.

Figure 5E:
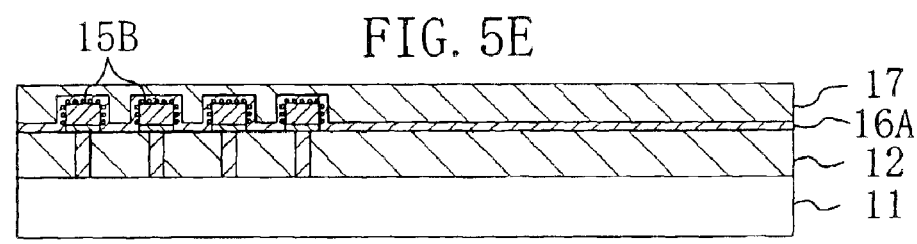

Next, as shown in FIG. 5E, a capacitance insulating film 16A composed of BST with a thickness of about 20 $\mu$m is formed by CVD on the interlayer insulating film 12 to cover the lower electrodes 15B formed with the precipitation layers 14$a$ composed of titanium. The second embodiment is characterized in that a BST film is formed by reducing an amount of Ti(THD)$_2$(O-i-Pr)$_2$ supplied as a titanium source from the initiation of the film formation till the thickness of the BST film under formation reaches about 3 nm, though it uses a solution prepared by dissolving Ba(THD)$_2$, Sr(THD)$_2$, and Ti(THD)$_2$(O-iPr)$_2$ in THF as the raw material of BST, similarly to the first embodiment. This allows the formation of the capacitance insulating film 16A in which the composition of titanium in the vicinity of the interface with each of the lower electrodes 15B is equal to that in the other region even if the precipitation layers 14$a$ composed of titanium are provided. Subsequently, an upper electrode forming film 17 composed of platinum (Pt) with a thickness of about 100 nm is formed by sputtering or CVD on the capacitance insulating film 16A. This provides a plurality of capacitors each composed of the lower electrode 15B, the capacitance insulating film 16A, and the upper electrode forming film 17.

Thus, the second embodiment also provides the capacitance insulating film 16A composed of BST which has a constantly uniform thickness and in which the composition of titanium is prevented from becoming excessively high due to the titanium atoms composing the precipitation layer 14$a$ serving as nuclei in BST film formation. This allows the first peak shown in FIG. 2B to disappear and optimizes the composition of titanium in the capacitance insulating film 16 to about 48% to 51%. As a result, the dielectric constant of the capacitance insulating film 16A is not reduced and a leakage current is not increased so that a capacitor with desired electric characteristics is obtainable.

In the second embodiment also, the precipitation layers 14$a$ may be formed prior to the patterning of the lower electrodes 15B as in the variation of the first embodiment.

Although each of the first embodiment, the variation thereof, and the second embodiment has used BST, i.e., barium strontium titanium oxide ((Ba,Sr)TiO$_3$) as an example of a material composing the capacitance insulating film 16 or 16A, a material composing the capacitance insulating film 16 or 16A is not limited thereto. Specifically, barium titanium oxide (BaTiO$_3$:BTO), strontium titanium oxide (SrTiO$_3$:STO), lead zirconium titanium oxide (Pb(Zr, Ti)O$_3$:PZT), or strontium bismuth tantalum oxide (SrBi$_2$Ta$_2$O$_9$:SBT) may also be used appropriately.

However, the compositions of the precipitation layer forming film 14 formed under the lower electrode forming film 15A should be changed depending on the material composing the capacitance insulating film 16 or 16A. For example, if BTO, STO, or PZT is used as a material composing the capacitance insulating film 16 or 16A, the precipitation layer forming film 14 is composed of titanium (Ti). If SBT is used as a material composing the capacitance insulating film 16 or 16A, the precipitation layer forming film 14 is composed of tantalum (Ta).

Although platinum has been used for the lower electrode forming film 15A, it is not limited thereto. If BST is used for the capacitance insulating film 16 or 16A, ruthenium (Ru), a ruthenium dioxide (RuO$_2$), or iridium (Ir) may be used appropriately. If SBT or PZT is used for the capacitance insulating film 16 or 16A, iridium (Ir) or an iridium dioxide (IrO$_2$) may be used appropriately.

What is claimed is:

1. A method for fabricating a semiconductor device including a capacitance insulating film having a perovskite structure represented by a general formula ABO$_3$ (where each of A and B is a metal element), the method comprising:
   a first step of forming a precipitation layer forming film containing the metal element A or B;
   a second step of forming a first electrode forming film on the precipitation layer forming film;
   a third step of patterning the first electrode forming film to form a first electrode from the first electrode forming film;
   a fourth step of annealing the first electrode to form, on a surface of the first electrode, a precipitation layer composed of the precipitated metal element A or B composing the precipitation layer forming film;
   a fifth step of forming, by chemical vapor deposition, the capacitance insulating film such that the first electrode including the precipitation layer is covered therewith; and
   a sixth step of forming a second electrode forming film such that the capacitance insulating film is covered therewith,
   wherein at the initial stage of the fifth step, the capacitance insulting film is formed such that a supply amount of a raw material of the capacitance insulating film is smaller than that supplied at other stages of the fifth step, and
   wherein the raw material contains the same metal element as that contained in the precipitation layer forming film.

2. The method of claim 1, wherein the precipitation layer forming film has a thickness not less than about 1 nm and not more than about 100 nm.

3. The method of claim 1, further comprising, between the first and second steps, the step of: partly oxidizing or nitriding the deposited precipitation layer forming film.

4. The method of claim 1, wherein the capacitance insulating film is composed of (Ba, Sr)TiO$_3$, BaTiO$_3$, SrTiO$_3$, Pb(Zr, Ti)O$_3$, or SrBi$_2$Ta$_2$O$_9$.

5. A method for fabricating a semiconductor device including a capacitance insulating film having a perovskite structure represented by a general formula ABO$_3$ (where each of A and B is a metal element), the method comprising:
   a first step of forming a precipitation layer forming film containing the metal element A or B;
   a second step of forming a first electrode forming film on the precipitation layer forming film;

a third step of annealing the first electrode to form, on a surface of the first electrode, a precipitation layer composed of the precipitated metal element A or B composing the precipitation layer forming film;

a fourth step of patterning the first electrode forming film to form a first electrode from the first electrode forming film;

a fifth step of forming, by chemical vapor deposition, the capacitance insulating film such that the first electrode including the precipitation layer is covered therewith; and a sixth step of forming a second electrode forming film such that the capacitance insulating film is covered therewith, wherein at the initial stage of the fifth step, the capacitance insulting film is formed such that a supply amount of a raw material of the capacitance insulating film is smaller than that supplied at other stages of the fifth step, and wherein the raw material contains the same metal element as that contained in the precipitation layer forming film.

6. The method of claim 5, wherein the precipitation layer forming film has a thickness not less than about 1 nm and not more than about 100 nm.

7. The method of claim 5, further comprising, between the first and second steps, the step of: partly oxidizing or nitriding the deposited precipitation layer forming film.

8. The method of claim 5, wherein the capacitance insulating film is composed of $(Ba, Sr)TiO_3$, $BaTiO_3$, $SrTiO_3$, $Pb(Zr, Ti)O_3$, or $SrBi_2Ta_2O_9$.

* * * * *